United States Patent [19]

Littlebury et al.

[11] Patent Number: 4,972,413
[45] Date of Patent: Nov. 20, 1990

[54] METHOD AND APPARATUS FOR HIGH SPEED INTEGRATED CIRCUIT TESTING

[75] Inventors: Hugh W. Littlebury, Chandler; Mavin C. Swapp, Mesa, both of Ariz.

[73] Assignee: Motorola, Inc., Schaumburg, Ill.

[21] Appl. No.: 327,878

[22] Filed: Mar. 23, 1989

[51] Int. Cl.$^5$ ............................................. G06F 11/00
[52] U.S. Cl. ................................. 371/22.1; 371/25.1; 371/27
[58] Field of Search ..................... 371/22.1, 22.3, 22.4, 371/22.5, 25.1, 27, 15.1; 324/73.1

[56] References Cited

U.S. PATENT DOCUMENTS

| | | | |
|---|---|---|---|
| 4,287,594 | 9/1981 | Shirasaka | 371/25 |
| 4,348,759 | 9/1982 | Schnurmann | 371/20 |
| 4,566,104 | 1/1986 | Bradshaw | 371/22.3 |
| 4,571,724 | 2/1986 | Belmondo | 371/22.1 |

Primary Examiner—Jerry Smith
Assistant Examiner—Robert W. Beausoliel
Attorney, Agent, or Firm—Joe E. Barbee; Stuart T. Langley

[57] ABSTRACT

An apparatus for use in high speed digital testing of high pin count logic circuits is provided wherein a plurality of terminal electronics units are connected in series to each other and to one channel of a multi-channel tester. Each pin electronics unit stores a test vector from the test channel in a first mode, and applies the test vector to the circuit under test at high speed in a second mode. Each pin electronics unit can also store response data from the circuit under test.

11 Claims, 1 Drawing Sheet

METHOD AND APPARATUS FOR HIGH SPEED INTEGRATED CIRCUIT TESTING

BACKGROUND OF THE INVENTION

The present invention relates, in general, to automated digital test systems. More particularly, the invention relates to a method and apparatus for loading and retrieving test data and response data into a data storage means connected to each terminal of a circuit under test.

A crucial step in manufacturing electronic circuits is testing those circuits under conditions that approximate actual use. As circuits become more complex, requiring more pins and higher operating speeds, it becomes difficult or impossible to test the circuit on existing equipment. It is particularly important for circuits which require high reliability to be tested at clock rates of several hundred MHz, where they will operate in use. Accordingly, methods for speeding up the test procedures have been developed in an effort to meet the demands of new circuits.

One area of particular interest is the transfer of test signals to and from the drivers and comparators which stimulate and monitor the circuit terminals. Testers usually have multiple force and measure circuits connected to the drivers and comparators, wherein each force and measure circuit is dedicated to one terminal of the circuit under test. The pattern of test signals, or test vectors, is stored in a pin memory which is also dedicated to the one terminal. The pin memory must be capable of supplying the stored test signal at the operating speed of the circuit under test. Test patterns are loaded into the pin memory from a mass storage means, which usually operates more slowly than the pin memory. Once loaded into the pin memory, test vectors are applied to the circuit terminal at high speed. For circuits with a large number of pins, however, the replication of force and measure circuits, pin memory, and pin electronics for each terminal becomes expensive. Also, the power requirements of the pin electronics becomes excessive, requiring elaborate and expensive circuit cooling techniques. Finally, the space required for such a large number of pin electronics is prohibitive as circuits to be tested become smaller.

As circuits become more complex and the number of terminals increases, manufacturers find themselves with test equipment having fewer test channels than the number of circuit terminals. This requires that test channels be multiplexed to support more than one terminal, or that new equipment be purchased. Multiplexing is often too slow and limits the the ability to completely test the circuit. New equipment with more test channels is increasingly expensive, and usually not yet available when the manufacturer first produces circuits. Thus, equipment can be used more efficiently if it is possible to support more than one circuit terminal with each test channel, while maintaining an ability to test at high speed.

Accordingly, it is an object of the present invention to provide a method and apparatus for transferring data between a tester and a logic circuit under test using a minimum number of components.

It is a further object of the present invention to provide a method and apparatus for transferring data between a tester and a logic circuit under test which is of minimal cost.

It is a further object of the present invention to provide a method and apparatus for transferring data between a tester and a logic circuit under test which is capable of transferring a signal at substantially the operating speed of a circuit under test.

It is a further object of the present invention to provide a method and apparatus for transferring data between a tester and a logic circuit under test which can support more than one circuit terminal per test channel.

It is a further object of the present invention to provide a method and apparatus for transferring data between a tester and a logic circuit under test which imposes no restrictions on the design of the logic circuit.

SUMMARY OF THE INVENTION

The above and other objects and advantages of the present invention are achieved by providing an apparatus for transferring data between a multi-channel tester and a logic circuit under test, the logic circuit having a plurality of terminals, or pins. The apparatus is capable of selectably transferring serial data between one test channel of the tester and a pin memory, or between the pin memory and the terminal, wherein the apparatus stores stimulus data in pin memories associated with input pins, and response data in pin memories associated with output pins. The apparatus includes multiple sets of pin electronics connected in serial fashion which allows each test channel to support multiple logic circuit terminals.

DETAILED DESCRIPTION OF THE DRAWINGS

Figure 1:
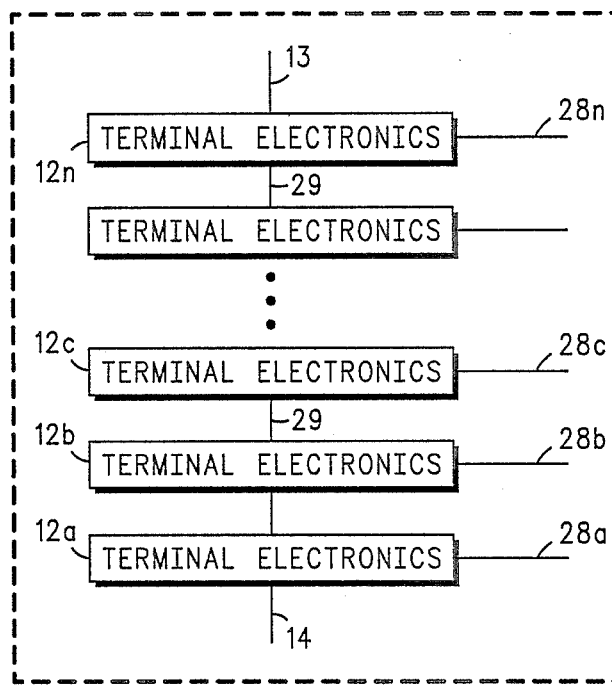
FIG. 1 illustrates a block diagram of a segment of test electronics connected in series to a single tester channel.

FIG. 1 illustrates a number of terminal electronics units 12 connected serially to form one segment 11 of the present invention. A multi-channel digital circuit tester (not shown) comprising a computer, a mass storage means for storing a test pattern and an expected output pattern, and a means to compare an actual output pattern with the expected output pattern, provides serial stimulus data on force line of one test channel, and analyzes serial response data on response line 13 of the test channel. The serial stimulus data comprises a pattern of logic stimulus, which is also called a test vector. The test vector, which may include many thousands of bits of data, is applied to each terminal of a logic circuit under test, forcing the logic circuit outputs to generate an output pattern. The output pattern, or response vector, is then sent serially to the tester on response line 13.

In prior art testers, each test channel is connected to a single logic circuit terminal 28. In the present invention segment 11 is connected to force line 14 and response line 13 of the one test channel. In a preferred embodiment a segment 11 exists for each tester channel available in the tester. A partial test vector is sent to segment 11 on force line 14 to first terminal electronics unit 12a. Terminal electronics units are connected to each other and to the test channel by scan path 29. When the circuit is in a data transfer mode, terminal electronics units 12 are configured so as to pass the partial test vector through each terminal electronics unit 12 until the first bit of the partial test vector has reached the last terminal electronics unit 12 in the series. It is useful to characterize groups of logic data in the partial test vector as words, whose length is determined by the terminal electronics units, as described hereinafter. Each word enters first terminal electronics unit 12a and is passed serially on to 12b, 12c, etc. until the first word reaches the last electronics unit 12n. Any number of electronics units 12 may be connected in series, the exact configuration is determined by the tester available and the number of terminals of the circuit under test. For example, if each channel of a sixty four channel tester comprises sixteen terminal electronics units 12, the tester will support a circuit with 1024 terminals 28. After the partial test vector is loaded into segment 11 each terminal electronics unit 12 stores the word of the partial test vector which that electronics unit currently contains. Once the partial test vector is stored, a new partial test vector is loaded into the segment in a similar manner. This process is repeated until the entire test vector from the tester is stored in the plurality of terminal electronics units 12.

Figure 2:
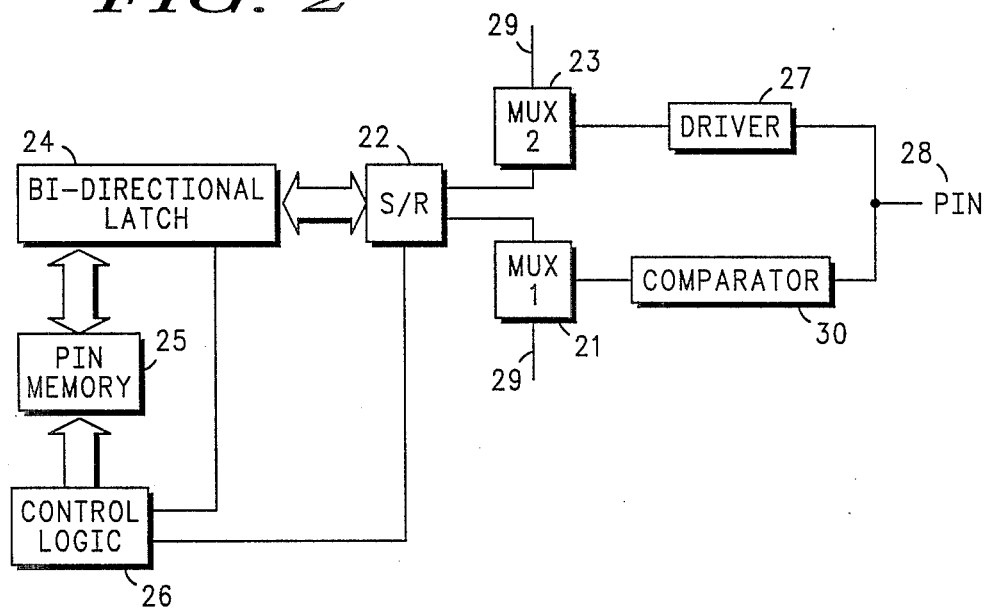
FIG. 2 illustrates a block diagram of a single terminal electronics unit.

FIG. 2. illustrates a block diagram of a single terminal electronics unit 12. When tester segment 11 is in data transfer mode, serial data enters multiplexer 21, which is connected to shift register 22. Shift register 22 is controlled by control logic 26, and in data transfer mode is clocked at a rate which is compatible with the mass storage means of the tester. This may be approximately twenty MHz. The partial test vector is shifted through shift register 22, and exits through multiplexer 23, which is connected to multiplexer 21 of a similar adjacent terminal electronics unit 12. Shift register 22 is any number of bits wide, the number of bits being the same as the word length. In a preferred embodiment, shift register 22 is a sixteen bit shift register. After the last word in the partial test vector is shifted into register 22 of first pin electronics unit 12a, bi-directional latch 24 is activated to store the word in addressable pin memory 25. Pin memory 25 is controlled by control logic 26 by a read/write control and an address selection bus. Pin memory 25 is configured such that a single address contains a complete test word. Thus, each pin electronics unit 12 stores one word of the partial test vector in a pin memory 25 associated with a single terminal 28 of the circuit under test. This process is repeated until the test vector is entirely transferred to pin memory 25, or until pin memory 25 is full. Each pin memory 25 is limited in size by the addressing ability of control logic 26, and by practical concerns of memory availability and speed. Typically, pin memory 25 may contain from eight thousand to sixty-four thousand bits or more. In data transfer mode, data travels from the tester, through each pin electronics unit 12, and back to the tester via scan path 29. Scan path 29 exists for each channel of the tester.

After the entire test vector has been stored in pin memory 25, the apparatus is placed in a run mode. In run mode, first multiplexer 21 and second multiplexer 23 are connected to comparator 30 and driver 27 respectively, and scan path 29 is disabled. Control logic 26 selectively addresses pin memory 25 and places memory 25 in read mode. Bi-directional latch 24 presents one word of the stored test vector to shift register 22 in parallel form. Shift register 22 is clocked at a high speed, transferring the stored test data to driver 27. Driver 27 provides a pattern of logic signals to terminal 28 which corresponds to the stored test pattern. After each word of the stored test vector is shifted out of shift register 22, control logic 26 addresses a new location in pin memory 25, thus presenting a new word to shift register 22, until pin memory 25 is exhausted. In this manner, the frequency of the output signal from shift register 22 is not limited by the speed of pin memory 25. Driver 27 usually comprises a means of coupling a logic high and a logic low voltage to terminal 28, and a means to format the signals to precisely control the shape and timing of the signal. In the preferred embodiment, sixteen bit shift register 22 operates sixteen times faster than pin memory 25, and the output signal can be as fast as eight hundred MHz while the memory operates at only 50 MHz. This allows pin memory 25 to be much larger, and to be made with less expensive components.

If terminal 28 is an output, the test vector contains no stimulus information, and driver 27 does not provide a logic signal to terminal 28. When no logic signal is provided on terminal 28, comparator 30 detects an output voltage on terminal 28, and outputs a signal corresponding to the detected voltage to multiplexer 21. A group of consecutive serial output data is called an output word, and consecutive words are combined to form the response vector. The response vector is shifted into shift register 22, until an entire response word is contained in shift register 22, at which time bi-directional latch 24 is activated, and pin memory 25 is placed in write mode. The response vector is then transferred from shift register 22 to pin memory 25.

It should be noted that control logic 26 is synchronized between each of terminal electronics units 12. The circuit under test is comprised of a plurality of terminals 28, which may be inputs or outputs depending on the configuration of the circuit under test. Because pin memory 25 can be loaded bi-directionally from a single shift register 22, electronics unit 12 supports either inputs or outputs with a minimum of components. Because the control logic is synchronized, while a test vector is being read out to an input pin 28 of the circuit under test, a response vector is being simultaneously recorded from an output pin 28 of another pin electronics unit 12. Any type or configuration of circuit can thus be tested by the apparatus by simply modifying the stored test vector.

Eventually, pin memory 25 will be exhausted at each input terminal 28, and will be full at each output terminal 28. When this occurs, the segment is placed in data transfer mode again, and scan path 29 is enabled while driver 27 and comparator 30 are disconnected. In this mode, multiplexers 21 and 23 are connected to adjacent terminal electronic units 12, and the response vector in pin memory 25 is transferred to shift register 22, and shifted out through multiplexer 23. At last terminal electronics unit 12n in segment 11, data is transferred out to the tester on response line 13. The response vector is then compared to the expected pattern in the tester, and a fail/pass decision is made.

By now it should be appreciated that an improved method and apparatus for transferring data between a multi-channel digital circuit tester and a circuit under test has been provided, wherein the apparatus uses fewer components for each terminal of a circuit under test resulting in a lower cost tester, allows a single test channel to test a plurality of terminals of a circuit under test while achieving testing speeds of several hundred megahertz, and imposes no design constraints on the logic circuit under test.

I claim:

1. An apparatus for transferring test data and response data between a multi-channel tester and a logic circuit under test, the apparatus capable of operating in one of a plurality of modes, the logic circuit having a plurality of terminals, each terminal of the plurality of terminals is an input or an output depending on the configuration of the logic circuit, the apparatus comprising: a plurality of electronic segments, each segment connected to a test channel of the multi-channel tester, wherein the test channel provides serial stimulus data to the segment and analyzes serial response data from the segment, each segment further including a plurality of terminal electronic units which are similar to each other, each coupled to one logic circuit terminal and connected serially to each other, the terminal electronic circuits further comprising: a memory means for storing stimulus data or response data; a bi-directional latch for transferring data into and out of the memory means; a converter means to convert parallel data from the memory means to serial date, and to convert serial data going to the memory means into parallel data, a first multiplexer connected to a serial input of the converter means for selecting serial data, wherein serial data from an adjacent terminal electronics unit is selected when the apparatus is in a first mode, or serial response data from the one logic circuit terminal to which the terminal electronics unit is connected is selected when the apparatus is in a second mode; a second multiplexer connected to a serial output of the converter means, for directing serial data, wherein serial data is directed to an adjacent terminal electronics unit when the apparatus is in the first mode, or towards the one logic circuit terminal to which the terminal electronics unit is connected when the apparatus is in the second mode; a means for stimulating each input terminal, controlled by serial data from the second multiplexer, a means for detecting the serial response signal from each output terminal and sending the response output signal to the first multiplexer.

2. The apparatus of claim 1 wherein each segment comprises sixteen terminals and sixteen terminal electronics units.

3. The apparatus of claim 2 further comprising sixty four electronic segments, the apparatus being capable of testing circuits with 1024 terminals.

4. The apparatus of claim 1 wherein the memory means comprises from 8K to 64K bits of storage.

5. The apparatus of claim 1 wherein the converter means is a shift register.

6. The apparatus of claim 1 wherein the means for stimulating each input terminal further comprises a means for switching a logic high and a logic low voltage to the terminal; and a means to format and precisely control shape and timing of the serial stimulus data.

7. An apparatus for transferring test data and response data between a multi-channel tester and a logic circuit under test, the apparatus capable of operating in one of a plurality of modes, the logic circuit having a plurality of terminals, each terminal of the plurality of terminals is an input or an output depending on the configuration of the logic circuit, the apparatus comprising: a plurality of electronic segments, each segment coupled to one test channel of the multi-channel tester, each segment further including a plurality of terminal electronic units which are similar to each other connected to each logic circuit terminal and connected serially to each other, the terminal electronic circuits further comprising: a memory means for storing stimulus data or response data; a bi-directional latch for transferring data into and out of the memory means; a converter means to convert parallel data from the memory means to serial data, and to convert serial data going to the memory means into parallel data, a first data path which allows the terminal electronics unit to communicate with two adjacent terminal electronics units; a second data path which allows the terminal electronics unit to communicate with one logic circuit terminal of the circuit under test; a means for selecting between the first data path and the second data path; a means for stimulating each logic circuit input terminal, controlled by data from the converter means; a means for detecting a serial output signal from each logic circuit output terminal and sending the serial output signal to the converter means.

8. The apparatus of claim 7 wherein each segment comprises sixteen terminals and sixteen terminal electronics units.

9. The apparatus of claim 8 wherein the converter means is a sixteen bit shift register.

10. The apparatus of claim 7 wherein the memory means comprises from 8K to 64K bits of storage.

11. A method of testing a logic circuit, the logic circuit having a plurality of terminals, each terminal of the plurality of terminals is an input or an output depending on the configuration of the logic circuit, comprising the steps of: providing a multi-channel tester, wherein each channel of the multi-channel tester sends a serial stimulus signal, and receives a serial response signal, wherein the apparatus operates in a first and a second mode, the first mode further comprising the steps of: breaking the serial stimulus signal into multi-bit words; converting the words to parallel stimulus signal data; storing the parallel stimulus data, wherein the second mode further comprises the steps of: converting the parallel stimulus data to serial stimulus data; transferring data to a drive means; stimulating a terminal with the drive means; comparing voltage at a logic circuit output terminal to a reference voltage; generating a response signal; storing the response signal; and sending the response signal to the multi-channel tester.

* * * * *